US010944165B2

(12) United States Patent
Yeh et al.

(10) Patent No.: US 10,944,165 B2
(45) Date of Patent: Mar. 9, 2021

(54) INTEGRATED ANTENNA PACKAGE STRUCTURE AND MANUFACTURING METHOD THEREOF

(71) Applicant: Powertech Technology Inc., Hsinchu County (TW)

(72) Inventors: Yun-Hsin Yeh, Hsinchu County (TW); Hung-Hsin Hsu, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 77 days.

(21) Appl. No.: 16/554,644

(22) Filed: Aug. 29, 2019

(65) Prior Publication Data
US 2020/0381812 A1    Dec. 3, 2020

(30) Foreign Application Priority Data
May 29, 2019   (TW) ................... 108118587

(51) Int. Cl.
| H01Q 1/38 | (2006.01) |
| H01L 21/56 | (2006.01) |
| H01L 23/31 | (2006.01) |
| H01L 23/66 | (2006.01) |
| H01Q 1/40 | (2006.01) |

(52) U.S. Cl.
CPC ............. *H01Q 1/38* (2013.01); *H01L 21/565* (2013.01); *H01L 23/3128* (2013.01); *H01L 23/66* (2013.01); *H01Q 1/40* (2013.01); *H01L 2223/6677* (2013.01)

(58) Field of Classification Search
CPC ............ H01Q 1/38; H01Q 1/40; H01Q 23/00; H01Q 21/0087; H01L 21/563; H01L 21/565; H01L 24/10; H01L 25/252; H01L 23/3128; H01L 2223/6677; H01L 2224/838; H01L 2224/48227; H01L 2924/14; H01L 2924/181; H01L 2021/60021
See application file for complete search history.

(56) References Cited

U.S. PATENT DOCUMENTS

| 6,535,175 B2 * | 3/2003 | Brady ................ G06K 19/0726 340/572.7 |
| 6,686,649 B1 * | 2/2004 | Mathews ............... H01L 23/552 257/659 |

(Continued)

FOREIGN PATENT DOCUMENTS

| CN | 208336188 | 1/2019 |
| TW | 201836117 | 10/2018 |

OTHER PUBLICATIONS

"Office Action of Taiwan Counterpart Application," dated Oct. 17, 2019, p. 1-p. 5.

*Primary Examiner* — Haissa Philogene
(74) *Attorney, Agent, or Firm* — JCIPRNET

(57) ABSTRACT

An integrated antenna package structure including a circuit board, a chip, an encapsulant and an antenna is provided. The chip is disposed on and electrically connected to the circuit board. The encapsulant encapsulates the chip. The encapsulant has a first surface and a second surface, wherein the normal vector of the first surface is different from the normal vector of the second surface. The antenna is disposed on the first surface and the second surface of the encapsulant. A manufacturing method of an integrated antenna package structure is also provided.

20 Claims, 12 Drawing Sheets

(56) References Cited

U.S. PATENT DOCUMENTS

| | | | |
|---|---|---|---|
| 6,853,087 B2* | 2/2005 | Neuhaus | H05K 3/4007 |
| | | | 257/778 |
| 9,390,365 B2* | 7/2016 | Ziemkus | H01L 23/49855 |
| 10,862,202 B1* | 12/2020 | Yeh | H01Q 1/38 |
| 2011/0316117 A1 | 12/2011 | Kripesh et al. | |
| 2017/0018513 A1 | 1/2017 | Yoo et al. | |

* cited by examiner

INTEGRATED ANTENNA PACKAGE STRUCTURE AND MANUFACTURING METHOD THEREOF

CROSS-REFERENCE TO RELATED APPLICATION

This application claims the priority benefit of Taiwan application serial no. 108118587, filed on May 29, 2019. The entirety of the above-mentioned patent application is hereby incorporated by reference herein and made a part of this specification.

BACKGROUND

Technical Field

The present invention is related to a package structure and a manufacturing method thereof, and more generally to an integrated antenna package structure and a manufacturing method thereof.

Description of Related Art

In the antenna on package (AoP) structure, an antenna is placed on the surface of the package to provide better transmission quality. In such design, how to improve the bonding between the antenna and the encapsulant, reduce the possibility of its damage and increase the signal transmission range is an important issue to be solved.

SUMMARY

The present invention provides an integrated antenna package structure and a manufacturing method thereof, in which the possibility of peeling and damage of the antenna can be reduced, and the signal transmission range can be increased.

The present invention provides an integrated antenna package structure including a circuit board, a chip, an encapsulant and an antenna. The chip is disposed on and electrically connected to the circuit board. The encapsulant encapsulates the chip. The encapsulant has a first surface and a second surface, wherein the normal vector of the first surface is different from the normal vector of the second surface. The antenna is disposed on the first surface and the second surface of the encapsulant.

The present invention provides a manufacturing method of an integrated antenna package structure that at least includes the following steps. A circuit board is provided. A chip is disposed on and electrically connected to the circuit board. An encapsulant is formed on the circuit board to encapsulate the chip. The encapsulant has a first surface and a second surface, and a normal vector of the first surface is different from a normal vector of the second surface. An antenna is formed on the first surface and the second surface of the encapsulant.

In view of the above, in the integrated antenna package structure of the present invention, the antenna is embedded in the encapsulant, so the possibility of peeling and damage of the antenna can be reduced. Furthermore, the antenna can be disposed on the first surface and the second surface of the encapsulant, and such disposition can enhance the signal transmission/reception in different directions and therefore increase the signal transmission range.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
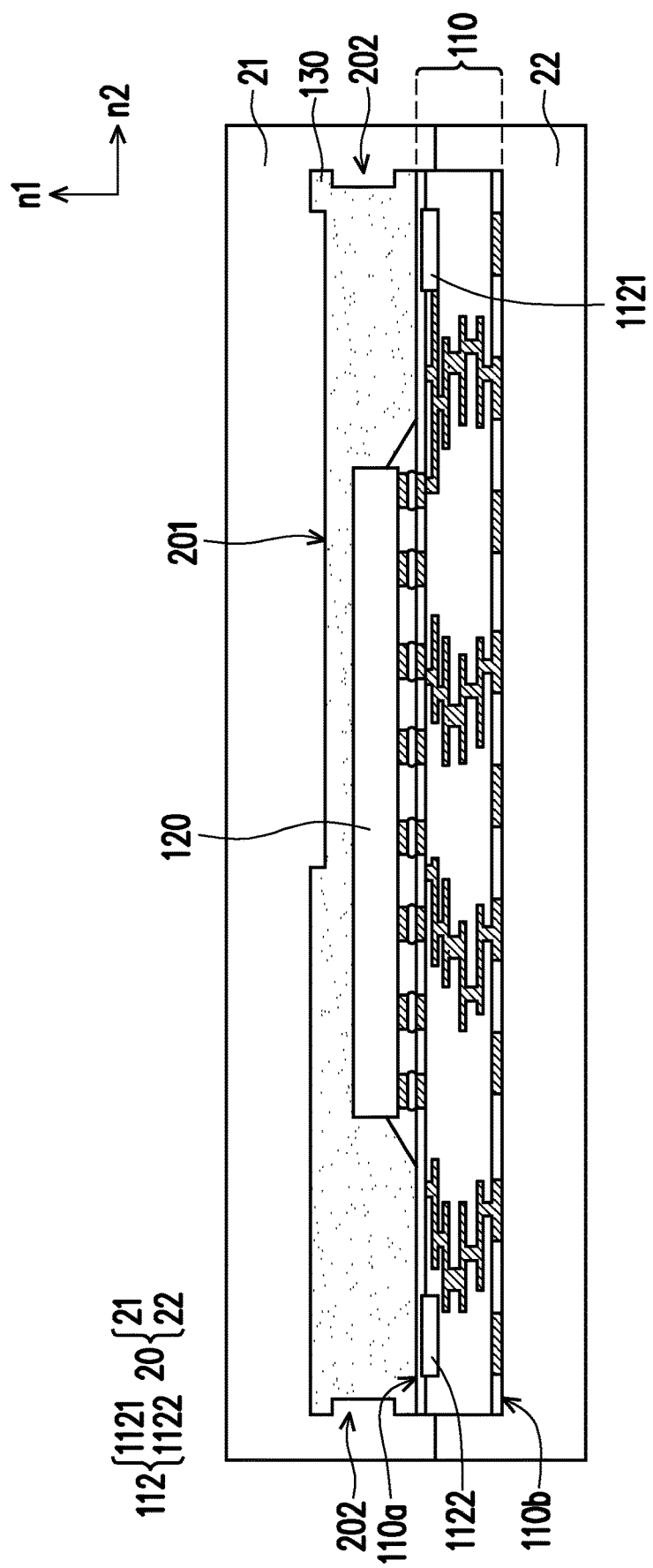
FIG. 1A to FIG. 1D are partial cross-sectional views showing part of a manufacturing method of an integrated antenna package structure according to a first embodiment of the present invention.

Herein, the directional terms (e.g., top, bottom, right, left, front, back, top, bottom) are merely used as a reference to the drawing and are not intended to imply the absolute orientation.

Unless otherwise expressly stated, any method described herein is not intended to be construed as performing its steps in a particular sequence.

The present invention will be described more fully with reference to the drawings of the embodiments. However, the invention may be embodied in various forms and should not be limited to the embodiments described herein. The thickness, dimension or size will be exaggerated for clarity. The same or similar reference numbers indicate the same or similar elements, and the following paragraphs are not be iterated herein.

FIG. 1A to FIG. 1D are partial cross-sectional views showing part of a manufacturing method of an integrated antenna package structure according to a first embodiment of the present invention. FIG. 1E is an enlarged schematic view of a region A in FIG. 1C. FIG. 1F is an enlarged schematic view of a region B in FIG. 1D.

In the present embodiment, the manufacturing method of an integrated antenna package structure 100 can include the following steps.

Referring to FIG. 1A, a circuit board 110 is provided. The circuit board 110 has a first surface 110a and a second surface 110b opposite to the first surface 110a. The circuit board 110 can be a printed circuit board or a plate having multiple wiring layers, but the present invention is not limited thereto. In the subsequent processes, the circuit board 110 is capable of carrying the structure formed thereon or the device disposed thereon.

Still referring to FIG. 1A, a chip 120 is disposed on the first surface 110a of the circuit board 110, and the chip 120 is electrically connected to the circuit board 110.

In the present embodiment, the chip 120 is disposed on the first surface 110a of the circuit board 110 with the active surface thereof facing the first surface 110a of the circuit board 110. In an embodiment, the chip 120 is disposed on the first surface 110a of the circuit board 110 in a flip-chip bonding manner, so that the chip 120 is electrically connected to the circuit board 110.

In an embodiment, the chip 120 can be a communication chip or a chip with a communication module.

Figure 1B:
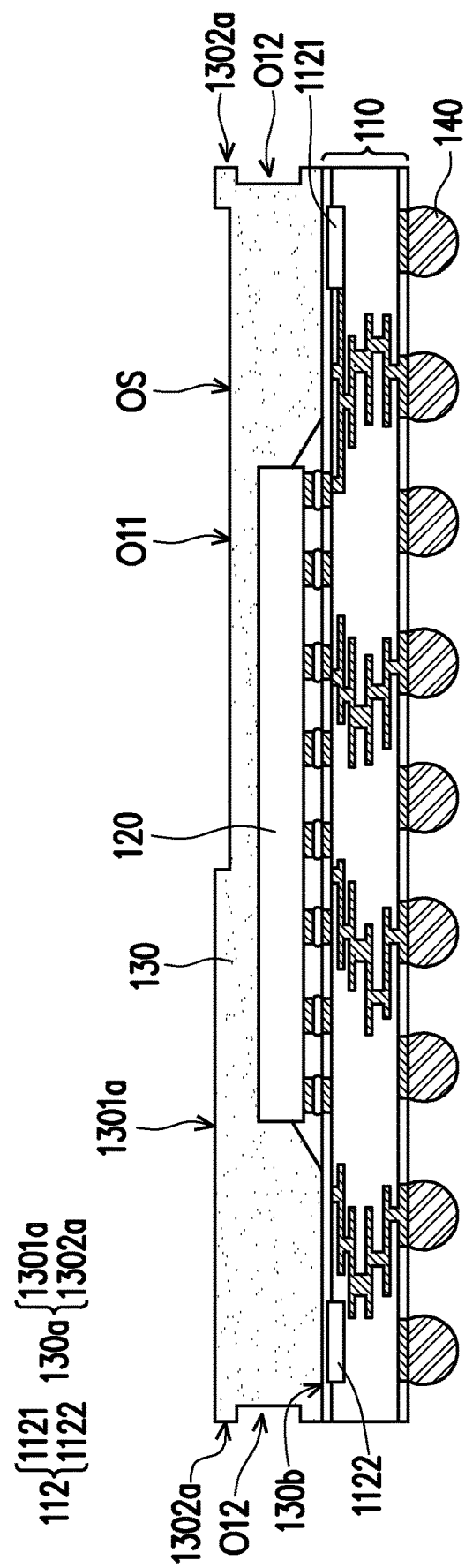

Referring to FIG. 1A and FIG. 1B simultaneously, after disposing the chip 120, an encapsulant 130 having a plurality of recesses O11 and O12 is formed on the first surface 110a of the circuit board 110, so as to encapsulate the chip 120.

In the present embodiment, the step of forming the encapsulant 130 having the recesses O11 and O12 can be described as follows.

Referring to FIG. 1A, a mold 20 is provided. The mold 20 can include an upper mold 21 and a lower mold 22, but the present invention is not limited thereto. The upper mold 21 can have a plurality of protrusions 201 and 202. It is noted that, in FIG. 1A, the mold 20 is provided merely for illustration purposes. The assembly of the mold 20 can be adjusted according to the design or implementation requirements. For example, the mold 20 may have multiple components depending on the assembly or disassembly requirements.

Thereafter, the circuit board 110 and the chip 120 are placed within the mold 20, and a molding process is performed with the mold 20, so as to form the encapsulant 130 having the recesses O11 and O12. The shape of the protrusions 201 and 202 correspond to the shape of the recesses O11 and O12, respectively. Afterwards, the mold 20 is removed to form the encapsulant 130 having the recesses O11 and O12.

It is noted that, the number of the circuit board 110 and/or the chip 120 placed within the mold 20 is not limited by the present invention.

The encapsulant 130 can completely cover the chip 120. The material of the encapsulant 130 can include an epoxy resin, a molding compound or another suitable insulating material. The forming method of the encapsulant 130 includes performing a compression molding, a transfer molding or another suitable sealing process.

In the present embodiment, the encapsulant 130 has an outer surface 130a and an inner surface 130b opposite to the outer surface 130a. The outer surface 130a of the encapsulant 130 may be the exposed surface of the encapsulant 130, and the inner surface 130b of the encapsulant 130 may be the surface of the encapsulant 130 in contact with the circuit board 110.

In the present embodiment, the outer surface 130a of the encapsulant 130 can include a first surface 1301a and a second surface 1302a. The first surface 1301a may be away from the circuit board 110, and the second surface 1302a may be connected to the circuit board 110 and the first surface 1301a. The first surface 1301a may be located above the chip 120. The second surface 1302a may be located on both sides of the chip 120.

In an embodiment, the first surface 1301a may be referred to as a top surface, and the second surface 1302a may be referred to as a side surface.

In the present embodiment, the normal vector n1 of the first surface 1301a can be different from the normal vector n2 of the second surface 1302a of the encapsulant 130. In an embodiment, the normal vector n1 of each position on the first surface 1301a is different from the normal vector n2 of each position on the second surface 1302a of the encapsulant 130. In an embodiment, the normal vector n1 of each position on the first surface 1301a is not parallel to the normal vector n2 of each position on the second surface 1302a of the encapsulant 130.

In the present embodiment, the protrusion 201 is configured corresponding to the upper side of the chip 120 and the protrusions 202 are configured corresponding to the both sides of the chip 120, so that the encapsulant 130 is formed to have the recess O11 located above the chip 120 and the recesses O12 located on both sides of the chip 120. In other words, the recess O11 is located at the first surface 1301a of encapsulant 130, and the recesses O12 are located at the second surface 1302a of encapsulant 130, and the recess O11 and the recesses O12 of the encapsulant 130 can be separated from each other.

In the present embodiment, as shown in FIG. 1B, one recess O11 can be formed at the first surface 1301a of the encapsulant 130, and two recesses O12 can be formed at the second surface 1302a of the encapsulant 130, but the present invention is not limited thereto.

In an embodiment, the encapsulant 130 can be a homogeneous material, and such homogeneous material can no longer be separated into different individual materials by a mechanical method (such as crushing, shearing, cutting, sawing, grinding, etc.). In other words, the encapsulant 130 may not have an interface even it is formed by different materials or different processes.

In the present embodiment, the recess O11 does not expose the circuit board 110, but the present invention is not limited thereto.

In an embodiment, the bottom surface OS of the recess O11 can be higher than the surface of the chip 120 farthest from the circuit board 110, but the present invention is not limited thereto.

In an embodiment, the mold 20 can also be a mold set having multiple components assembled together, but the present invention is not limited thereto. As long as the mold 20 has corresponding protrusions (e.g., protrusions 201 and 202), such mold can fall within the scope of the present invention.

In the present embodiment, the encapsulant 130 having the recesses O11 and O12 can be directly formed by using the mold 20 with the protrusions 201 and 202. Therefore, in this embodiment, the material usage can be further reduced and the process steps can be further simplified.

Figure 1C:
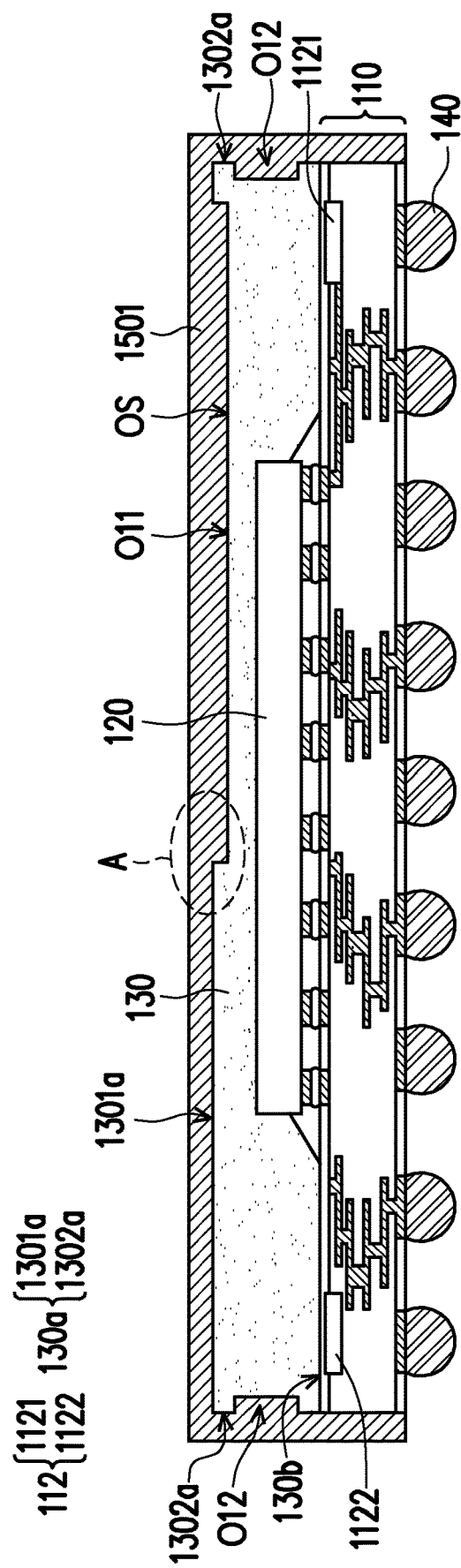
Figure 1D:
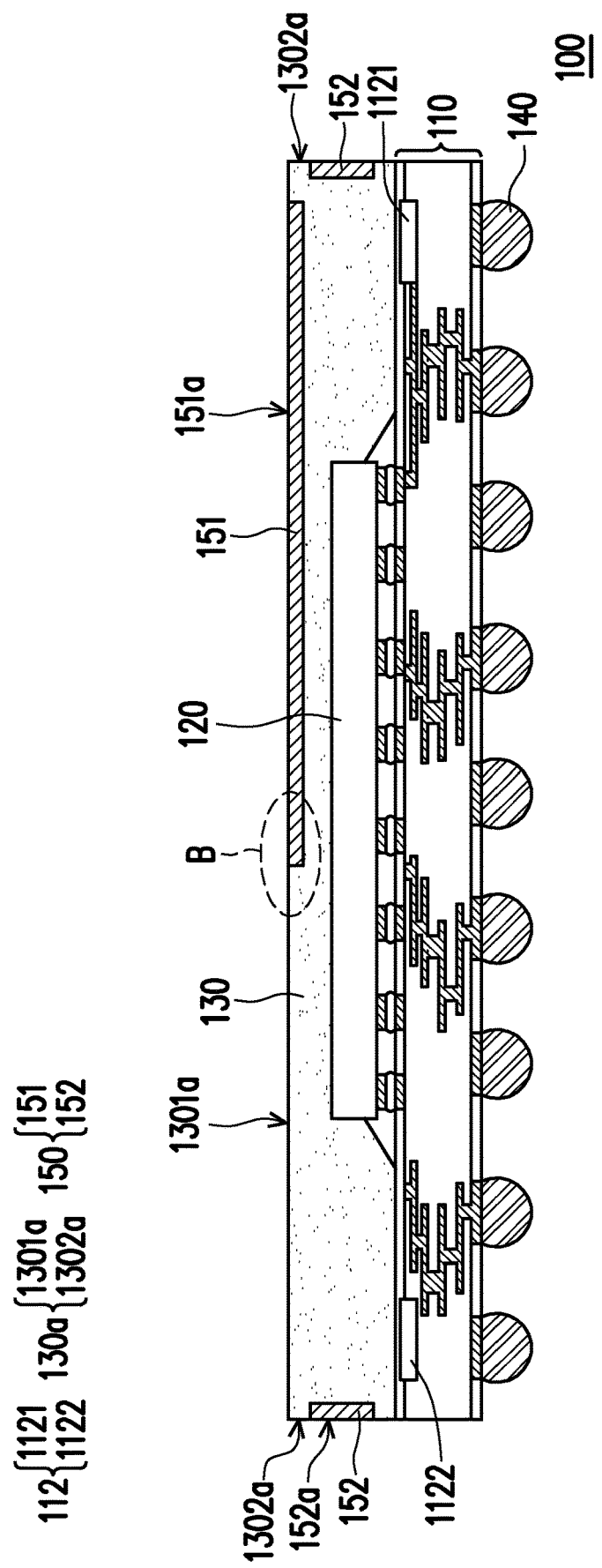
Figure 1E:
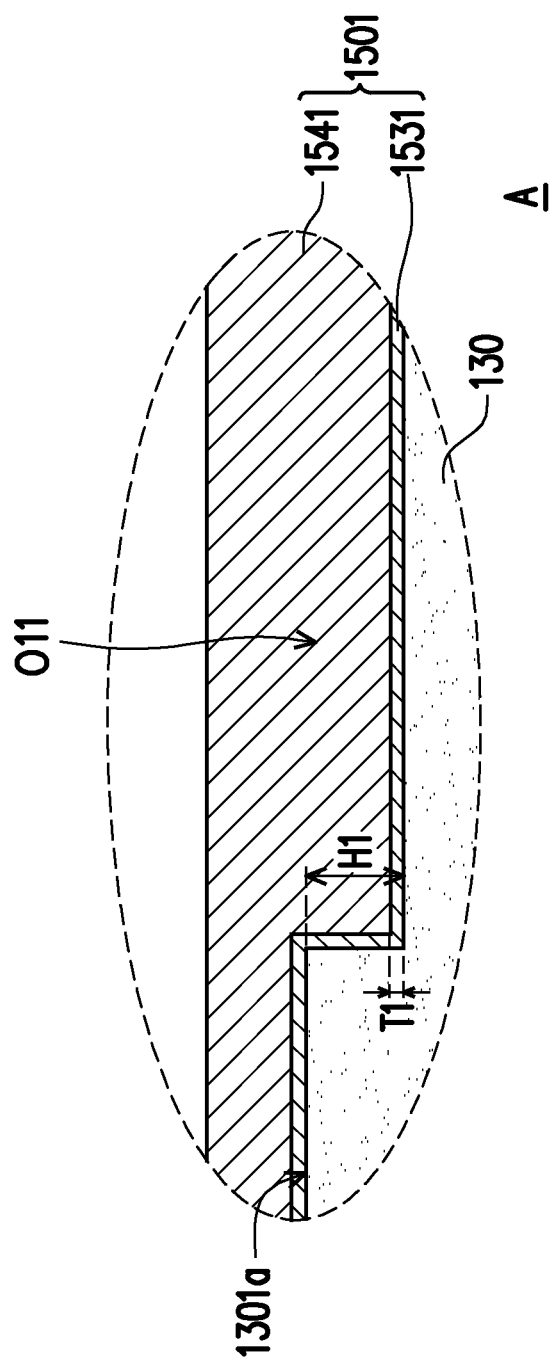
FIG. 1E is an enlarged schematic view of a region A in FIG. 1C.
Figure 1F:
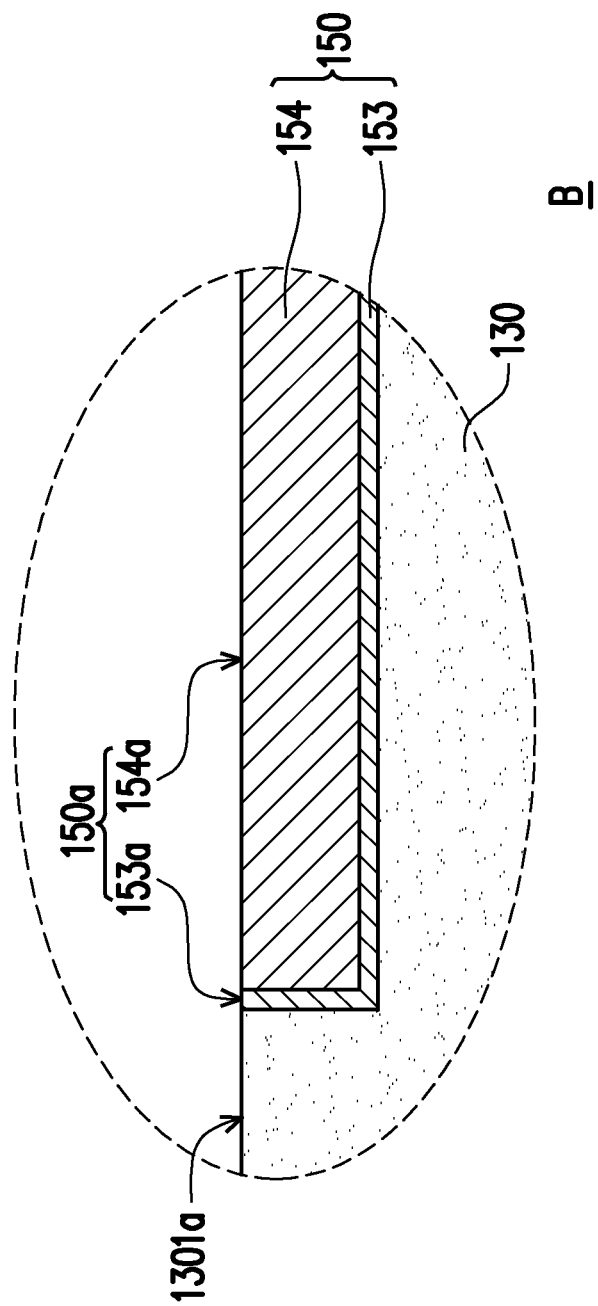
FIG. 1F is an enlarged schematic view of a region B in FIG. 1D.

Referring to FIG. 1B to FIG. 1D, after forming the encapsulant 130 having the recesses O11 and O12, an antenna 150 is formed in the recesses O11 and O12. In the present embodiment, the antenna 150 can include a first antenna 151 formed in the recess O11 and a second antenna 153 formed in the recesses O12. In other words, the first antenna 151 is disposed on the first surface 1301a of the encapsulant 130, and the second antenna 153 is disposed on the second surface 1302a in the encapsulant 130.

In this embodiment, the first antenna 151 and the second antenna 153 can be separated from each other.

In the present embodiment, the step of forming the antenna 150 can be described as follows.

Referring to FIG. 1B to FIG. 1C and FIG. 1E, a conductive material layer 1501 is formed within the recesses O11 and O12. The conductive material layer 1501 can include a first conductive material layer 1531 and a second conductive material layer 1541.

In an embodiment, the first conductive material layer 1531 can be formed by a sputtering or another suitable method. After forming the first conductive material layer 1531, the second conductive material layer 1541 can be formed on the first conductive material layer 1531 by an electroplating or another suitable method. The material of the first conductive layer 1531 can include titanium, copper, nickel, aluminum, tungsten, cobalt or another suitable conductive material, and the second conductive layer 1541 can include titanium, copper, nickel or another suitable conductive material.

In an embodiment, the first conductive layer 1531 can include a material different from that of the second conductive layer 1541.

In an embodiment, as compared to the first conductive layer 1531, the second conductive layer 1541 can have a higher conductivity.

In an embodiment, the first conductive layer 1531 can be referred to as a seed layer.

In another embodiment, the first conductive layer 1531 can be referred to as a conductive adhesive layer. In other words, as compared to the second conductive layer 1541, the first conductive layer 1531 exhibits a better adhesion to the encapsulant 130.

In an embodiment, the first conductive material layer 1531 can conformally cover the outer surface 130a of the encapsulant 130, but the present invention is not limited thereto.

In an embodiment, the thickness T1 of the first conductive material layer 1531 can be less than the depth H1 of the recess O11. In other words, the first conductive material layer 1531 may not fill up the recess O11.

Referring to FIG. 1C to FIG. 1D and FIG. 1E to FIG. 1F, after forming the conductive material layer 1501, a portion of the conductive material layer 1501 can be removed to form the antenna 150.

In an embodiment, the portion of the conductive material layer 1501 can be removed by a planarization process. The planarization process can include a chemical-mechanical polishing (CMP) process, a mechanical grinding process or another suitable process, but the present invention is not limited thereto.

During the step of removing the portion of the conductive material layer 1501, a portion of the first conductive layer 1531 and a portion of the second conductive layer 1541 can be removed, so as to form a first conductive layer 153 and a second conductive layer 154. The antenna 150 may be constituted by the first conductive layer 153 and second conductive layer 154. That is to say, the antenna 150 can include the first conductive layer 153 and the second conductive layer 154.

The first conductive layer 153 has a first conductive surface 153a, the second conductive layer 154 has a second conductive surface 154a, and the first conductive surface 153a and the second conductive surface 154a can constitute an outer surface 150a of the antenna 150. In other words, the outer surface 150a of the antenna 150 can include the first conductive surface 153a and the second conductive surface 154a.

After performing the planarization process, the outer surface 150a of the antenna 150 can be substantially coplanar with the outer surface 130a of the encapsulant 130. For example, the first exposed surface 151a of the first antenna 151 is coplanar with the first surface 1301a, and the second exposed surface 152a of the second antenna 152 is coplanar with the second surface 1302a.

In an embodiment, the antenna 150 may not have another layer on the outer surface 150a thereof, but the present invention is not limited thereto.

In the present embodiment, the antenna 150 can be embedded in the encapsulant 130. Therefore, the possibility of peeling and damage of the antenna 150 can be reduced. Furthermore, the antenna 150 can be formed on the second surface 1302a at both side of the chip 120, so as to enhance the signal transmission/reception in different directions and therefore increase the signal transmission range.

In an embodiment, multiple conductive terminals 140 are formed on the second surface 110b of the circuit board 110, and the conductive terminals 140 are electrically connected to the circuit board 110. For example, the conductive terminals 140 can be formed by a ball placement process and/or a reflow process. For example, the conductive terminals 140 can be solder balls.

The forming sequence of the conductive terminals 140 is not limited by the present invention. In an embodiment, the conductive terminals 140 are formed before the antenna 150 is formed. In another embodiment, the conductive terminals 140 are formed after the antenna 150 is formed.

In the present embodiment, the circuit board 110 can have multiple coupling terminals 112, the coupling terminals 112 are proximate to the first surface 110a of the circuit board 110, and the coupling terminals 112 are electrically connected to the chip 120.

In the present embodiment, the coupling terminals 112 can be electrically insulated from the antenna 150, while the coupling terminals 112 are electrically coupled to the antenna 150. In other words, the electromagnetic signal can be transmitted between the coupling terminals 112 and the antenna 150 by means of inductive coupling.

In an embodiment, a conductive material is not present between each coupling terminal 112 and the antenna 150, and the projection of the coupling terminal 112 on the circuit board 110 is overlapped with the projection of the antenna 150 on the circuit board 110.

In the present embodiment, the coupling terminal 112 can be disposed corresponding to the antenna 150. For example, the coupling terminal 112 can include coupling terminals 1121 and 1122, and the coupling terminals 1121 and 1122 are respectively located on both sides of the chip 120. As shown in FIG. 1D, the coupling terminal 1121 can be configured corresponding to the first antenna 151 and the second antenna 152, and the coupling terminal 1122 can be configured corresponding to the second antenna 152 only. Therefore, the coupling terminal 1121 can transmit/receive signals of the first antenna 151 and the second antenna 152, and the coupling terminal 1122 can transmit/receive the signal of the second antenna 152, but the invention is not limited thereto.

In the present embodiment, a conductive material is not present between the coupling terminal 1121 and the first antenna 151, and the projection of the coupling terminal 1121 on the circuit board 110 is overlapped with the projection of the first antenna 151 on the circuit board 110.

After the above process, the fabrication of the integrated antenna package structure 100 of the present embodiment can be substantially completed. The integrated antenna package structure 100 includes a circuit board 110, a chip 120, an encapsulant 130 and an antenna 150. The chip 120 is disposed on and electrically connected to the circuit board 110. The encapsulant 130 encapsulates the chip 120. The encapsulant 130 has a first surface 1301a and a second surface 1302a. The normal vector n1 of the first surface 1301a is different from the normal vector n2 of the second surface 1302a of the encapsulant 130. The antenna 150 is disposed on the first surface 1301a and the second surface 1302a of the encapsulant 130.

In the integrated antenna package structure 100, the antenna 150 is embedded in the encapsulant 130, so the possibility of peeling and damage of the antenna 150 can be reduced. Furthermore, the antenna can be disposed on the first surface 1301a and the second surface 1302a of the encapsulant 130, and such disposition can enhance the signal transmission/reception in different directions and therefore increase the signal transmission range.

Figure 2A:
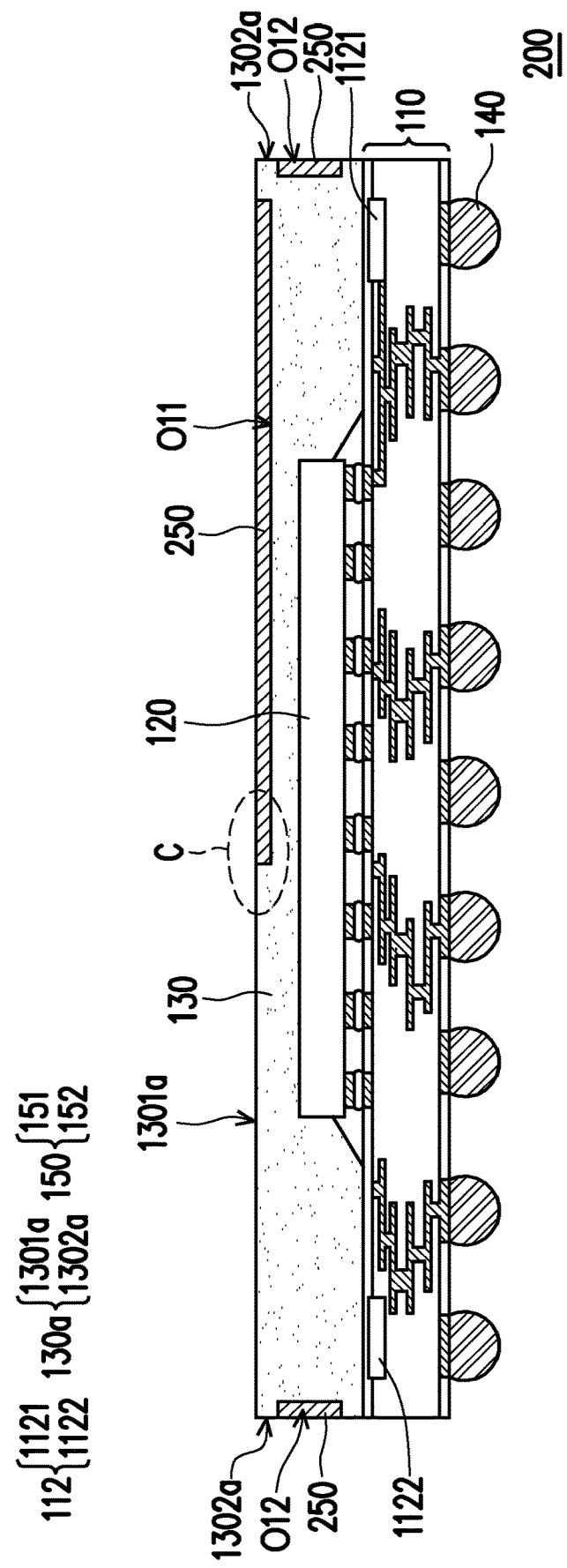
FIG. 2A is a partial cross-sectional view showing part of a manufacturing method of an integrated antenna package structure according to a second embodiment of the present invention.
Figure 2B:
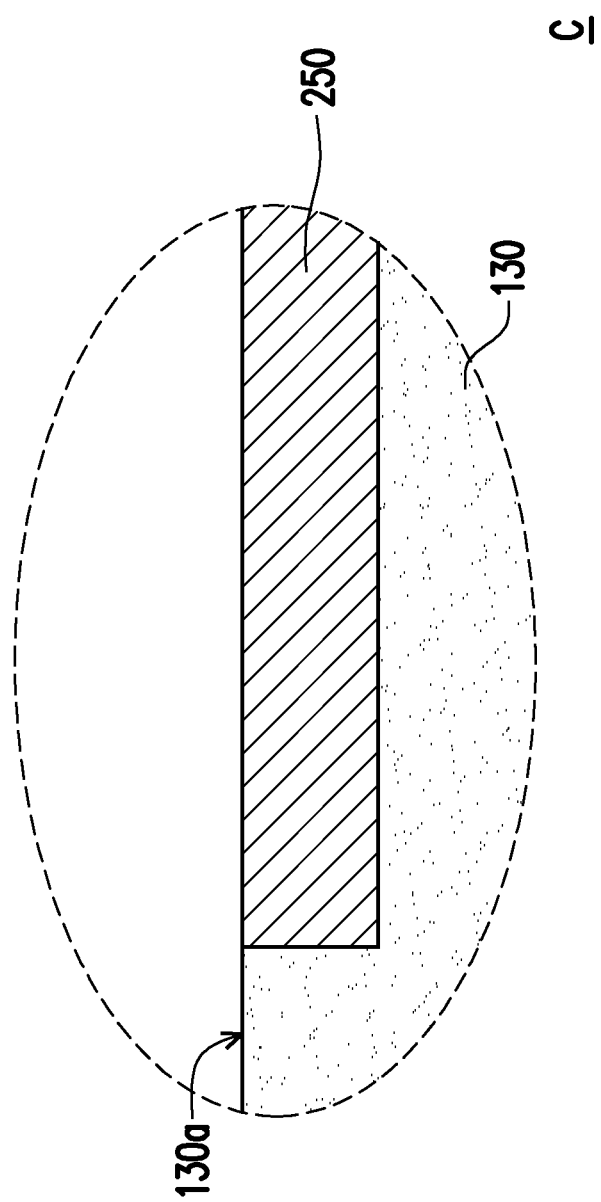
FIG. 2B is an enlarged schematic view of a region C in FIG. 2A.

FIG. 2A is a partial cross-sectional view showing part of a manufacturing method of an integrated antenna package structure according to a second embodiment of the present invention. FIG. 2B is an enlarged schematic view of a region C in FIG. 2A. The integrated antenna package structure 200 of this embodiment is similar to the integrated antenna package structure 100 of the first embodiment, in which similar elements are denoted by the same reference numerals and are assumed to have similar functions, materials or forming methods, so the descriptions thereof are omitted hereinafter. Specifically, FIG. 2A to FIG. 2B are partial cross-sectional views showing part of a manufacturing method of the integrated antenna package structure following the step of FIG. 1B.

As shown in FIG. 2A, following the step of FIG. 1B, after forming an encapsulant 130 having recesses O11 and O12, an antenna 250 is formed within the recesses O11 and O12.

In the present embodiment, the step of forming the antenna 250 can be described as follows.

Referring to FIG. 2B, the antenna 250 can be formed by a printing process.

For example, a silver paste, an aluminum paste or another suitable conductive paste can be filled into the recesses O11 and O12. Then, the conductive paste in the recesses O11 and O12 can be solidified to form the antenna 250.

In the present embodiment, a planarization process can be omitted (but without limiting the need for a planarization process), so the material usage can be further reduced and the process steps can be further simplified.

Figure 3A:
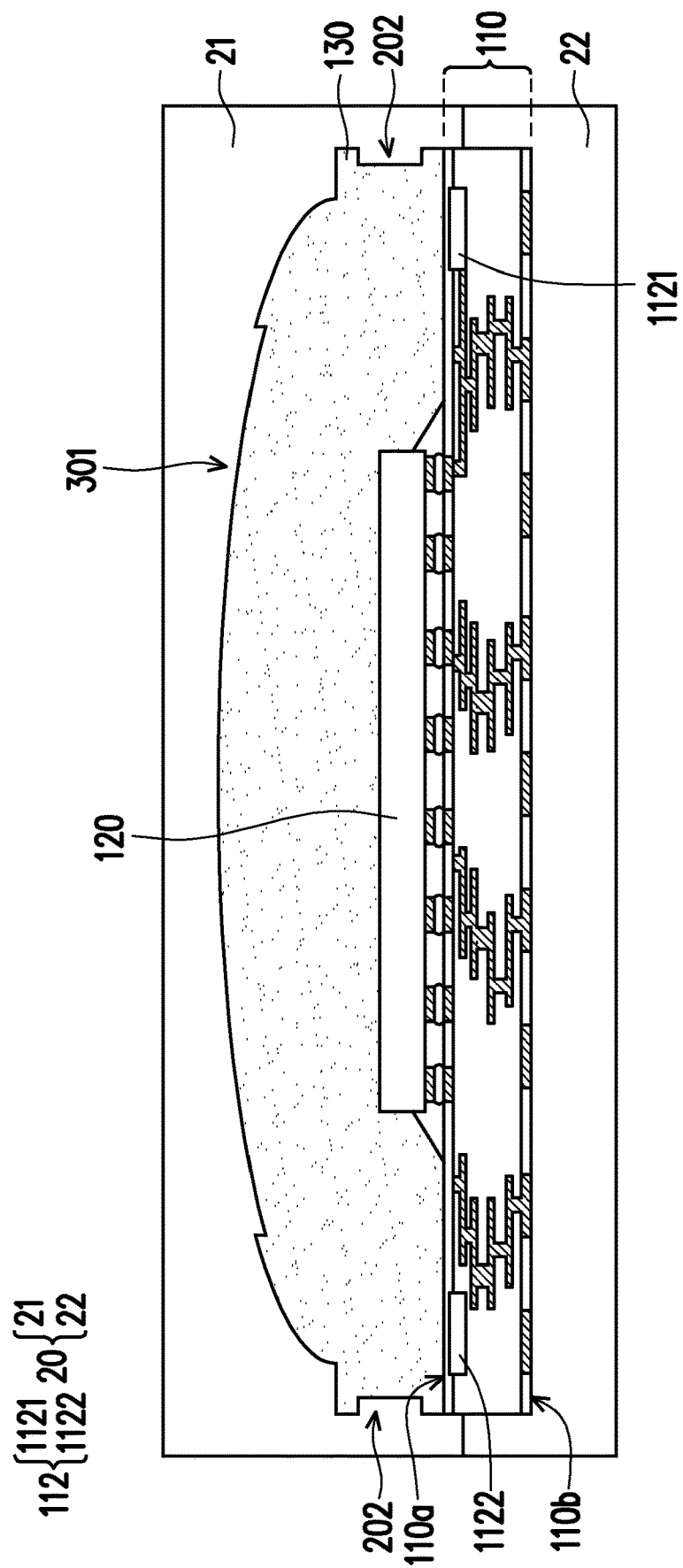
FIG. 3A to FIG. 3D are partial cross-sectional views showing part of a manufacturing method of an integrated antenna package structure according to a third embodiment of the present invention.
Figure 3B:
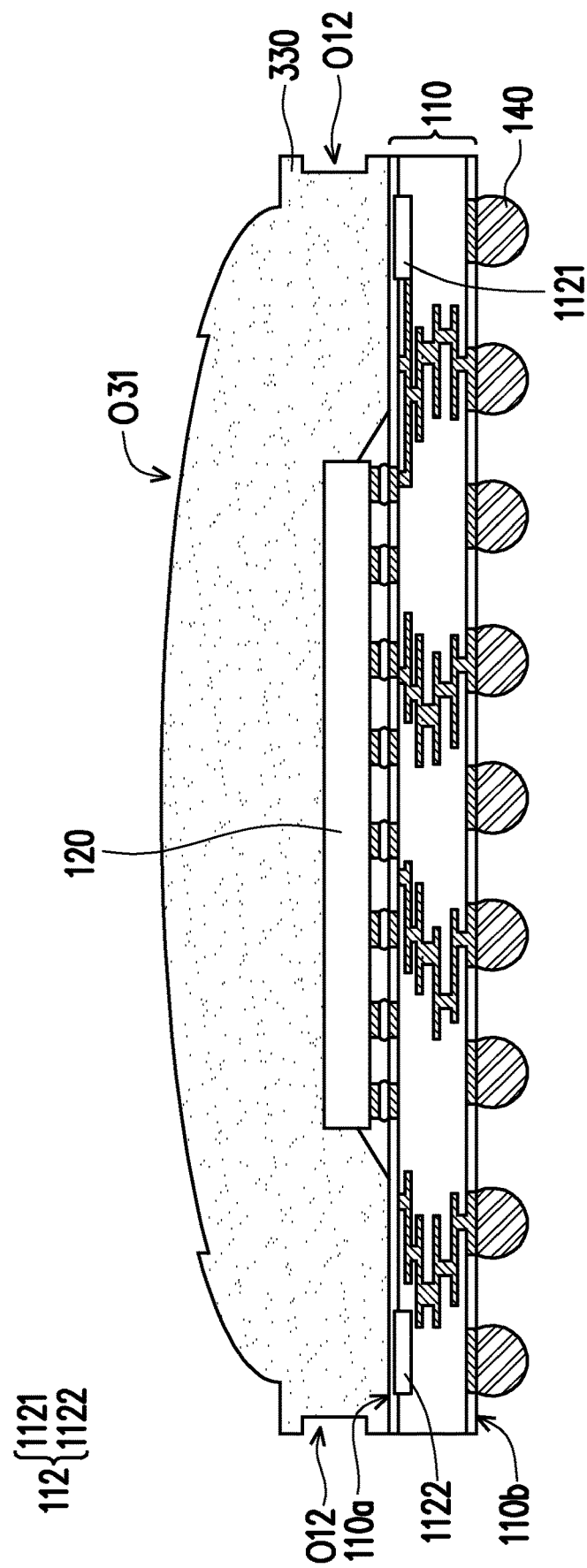

FIG. 3A to FIG. 3B are partial cross-sectional views showing part of a manufacturing method of an integrated antenna package structure according to a third embodiment of the present invention. The integrated antenna package structure 300 of this embodiment is similar to the integrated antenna package structure 100 of the first embodiment, in which similar elements are denoted by the same reference numerals and are assumed to have similar functions, materials or forming methods, so the descriptions thereof are omitted hereinafter. The difference between the integrated antenna package structure 300 and the integrated antenna package structure 100 lies in that, the first exposed surface 351a of the first antenna 351 of the integrated antenna package structure 100 is not planar.

Referring to FIG. 3A, similar to the step of FIG. 1A, a circuit board 110 is provided, and circuit board 110 can have a coupling terminal 112. Thereafter, a chip 120 is disposed on the first surface 110a of the circuit board 110. The chip 120 is electrically connected to the circuit board 110.

Referring to FIG. 3A and FIG. 3B simultaneously, a molding process is performed with a mold 20 with protrusions 301 and 202, so as to form an encapsulant 330 having the recesses O31 and O12 and therefore encapsulate the chip 120. The shape of the protrusion 301 corresponds to the shape of the recess O31. The protrusion O31 has an arc shape, so the recess O31 is formed to have a corresponding arc shape. Herein, the bottom surface of the recess O31 is protruded toward the direction away from the circuit board 110, but the present invention is not limited thereto. Afterwards, the mold 20 is removed.

In an embodiment, multiple conductive terminals 140 are further formed on the second surface 110b of the circuit board 110, and the conductive terminals are electrically connected to the circuit board 110.

Figure 3C:
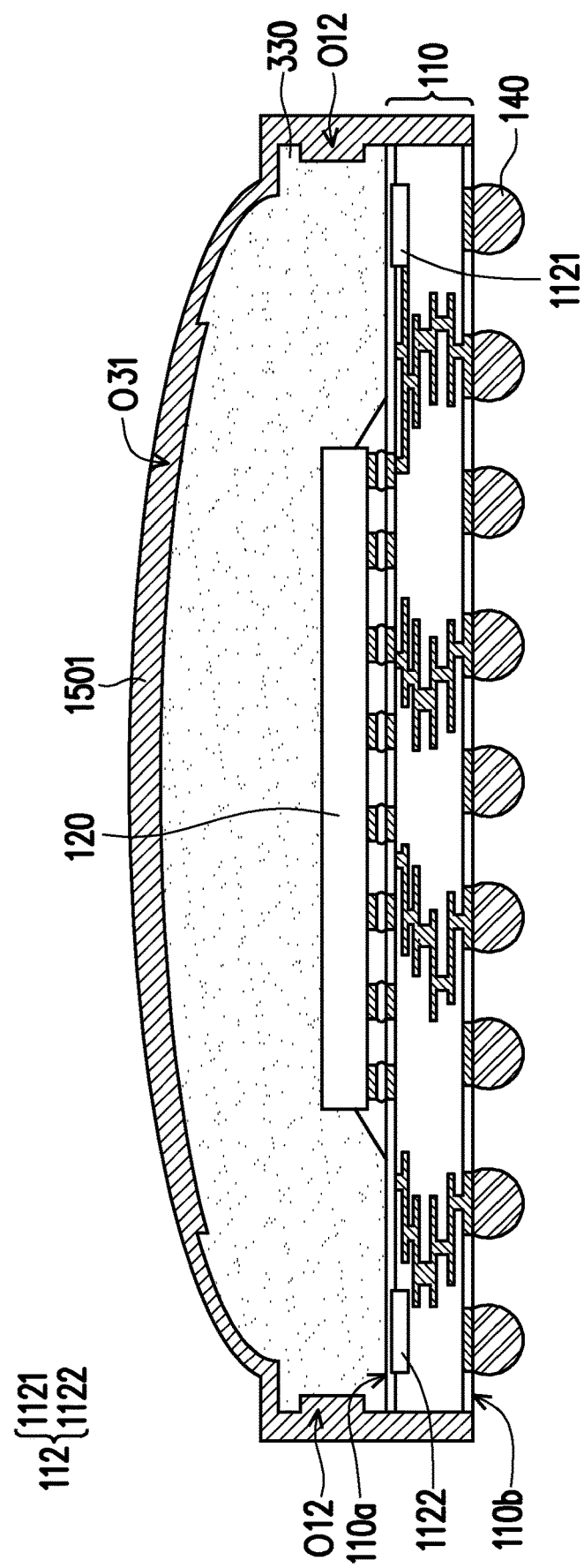

Referring to FIG. 3C, similar to the step of FIG. 1C, after the encapsulant 330 having the recesses O31 and O12 is formed, a conductive material layer 1501 is formed in the recesses O31 and O12. The method of forming the conductive material layer 1501 includes performing an electroplating, for example.

Figure 3D:
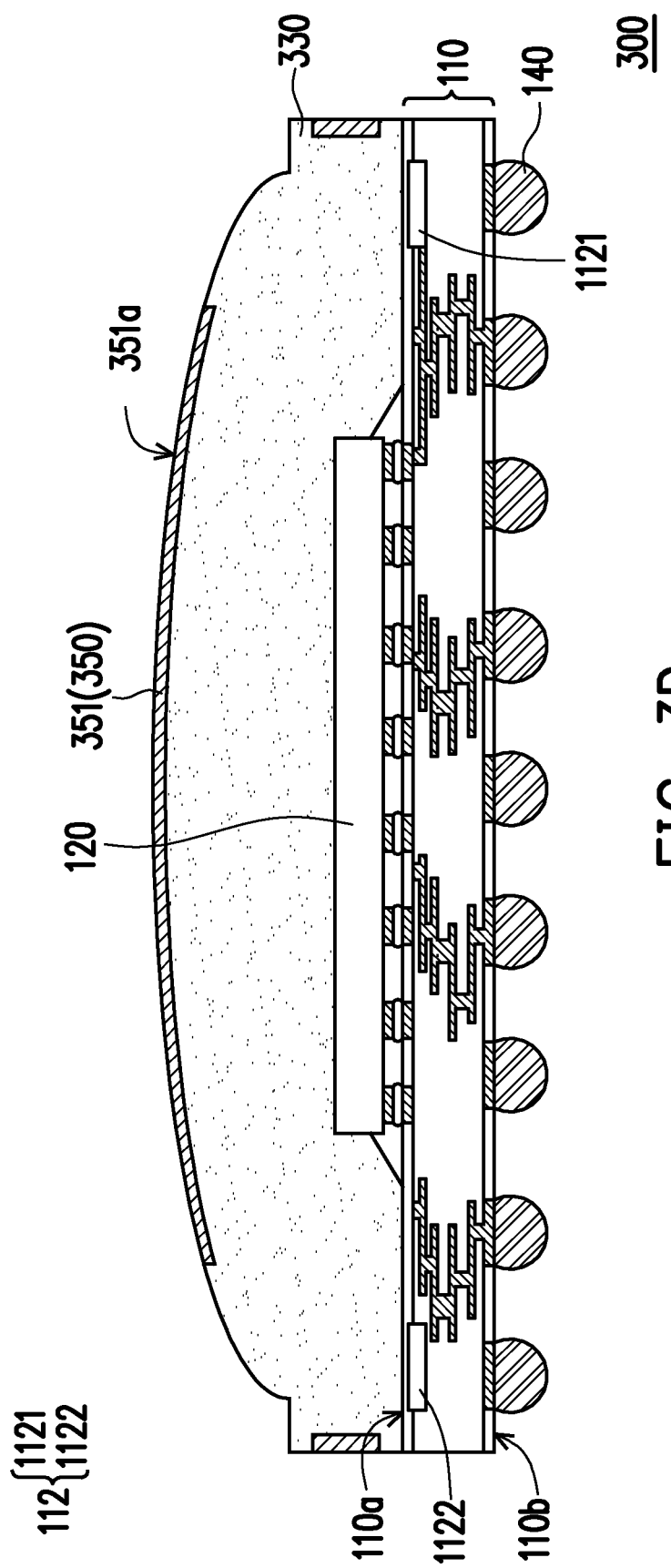

Referring to FIG. 3D, similar to the step of FIG. 1D, after the conductive material layer 1501 is formed, a portion of the conductive material layer 1501 is removed, so as to form an antenna 350 in the recesses O31 and O12. In the present invention, a first antenna 351 of the antenna 350 is formed within the recess O31, and thus, the first exposed surface 351a of the first antenna 351 is not planar. In other words, the first exposed surface 351a of the first antenna 351 has an arc shape corresponding to the shape of the recess O31.

In summary, in the integrated antenna package structure of the present invention, the antenna is embedded in the encapsulant, so the possibility of the peeling and damage of the antenna can be reduced. Furthermore, the antenna can be disposed on the first surface and the second surface of the encapsulant, and such disposition can enhance the signal transmission/reception in different directions and therefore increase the signal transmission range. Besides, in the present invention, the antenna can be formed by the mold with protrusions or by a printing process, so the material usage can be reduced and the process steps can be simplified.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An integrated antenna package structure, comprising:
   a circuit board;
   a chip, disposed on and electrically connected to the circuit board;
   an encapsulant, encapsulating the chip, wherein the encapsulant has a first surface and a second surface, wherein a normal vector of the first surface is different from a normal vector of the second surface; and
   an antenna, disposed on the first surface and the second surface of the encapsulant.

2. The integrated antenna package structure of claim 1, wherein
   the first surface is away from the circuit board; and
   the second surface is connected to the first surface and the circuit board.

3. The integrated antenna package structure of claim 2, wherein the antenna comprises:
   a first antenna, disposed on the first surface; and
   a second antenna, disposed on the second surface, wherein the first antenna and the second antenna are separated from each other.

4. The integrated antenna package structure of claim 3, wherein a first exposed surface of the first antenna is not planar.

5. The integrated antenna package structure of claim 1, wherein the antenna is embedded in the encapsulant.

6. The integrated antenna package structure of claim 3, wherein a projection of the first antenna of the antenna on the circuit board is overlapped with a projection of the chip on the circuit board.

7. The integrated antenna package structure of claim 1, wherein the encapsulant is a homogeneous material.

8. The integrated antenna package structure of claim 1, wherein the chip is electrically insulated from the antenna.

9. The integrated antenna package structure of claim 8, wherein
the circuit board has a coupling terminal;
the coupling terminal is electrically connected to the chip; and
the coupling terminal is electrically coupled to the antenna.

10. The integrated antenna package structure of claim 9, wherein a conductive material is not present between the coupling terminal and a portion of the antenna.

11. The integrated antenna package structure of claim 9, wherein the coupling terminal is disposed corresponding to the antenna.

12. The integrated antenna package structure of claim 1, wherein
the antenna comprises a first conductive layer and a second conductive layer;
the second conductive layer is located between the first conductive layer and the encapsulant;
the first conductive layer has a first conductive surface;
the second conductive layer has a second conductive surface; and
the first conductive surface and the second conductive surface constitute an exposed surface of the antenna.

13. The integrated antenna package structure of claim 12, wherein a material of the first conductive layer is different from a material of the second conductive layer.

14. A manufacturing method of an integrated antenna package structure, comprising:
providing a circuit board;
disposing a chip on the circuit board, wherein the chip is electrically connected to the circuit board;
forming an encapsulant on the circuit board to encapsulate the chip, wherein the encapsulant has a first surface and a second surface, and a normal vector of the first surface is different from a normal vector of the second surface; and
forming an antenna on the first surface and the second surface of the encapsulant.

15. The manufacturing method of claim 14, wherein the encapsulant has a plurality of recesses at the first surface and the second surface, and the antenna is formed within the plurality of recesses.

16. The manufacturing method of claim 15, wherein the step of forming the encapsulant having the plurality of recesses comprises:
providing a mold with a plurality of protrusions;
performing a molding process with the mold, so as to form the encapsulant having the plurality of recesses, wherein a shape of the plurality of protrusions corresponds to a shape of the plurality of recesses; and
removing the mold.

17. The manufacturing method of claim 15, wherein the step of forming the antenna comprises:
forming a first conductive material layer on the encapsulant, wherein a thickness of the first conductive material layer is less than a depth of the plurality of recesses;
forming a second conductive material layer on the first conductive material layer; and
removing a portion of the first conductive material layer and a portion of the second conductive material layer, so as to form the antenna.

18. The manufacturing method of claim 15, wherein the plurality of recesses does not expose the circuit board.

19. The manufacturing method of claim 14, wherein the chip is flip-chip mounted on the circuit board.

20. The manufacturing method of claim 14, wherein a method of forming the antenna comprises performing a printing process.

* * * * *